(12) United States Patent
Graves et al.

(10) Patent No.: US 11,881,261 B2
(45) Date of Patent: Jan. 23, 2024

(54) CAMS FOR LOW LATENCY COMPLEX DISTRIBUTION SAMPLING

(71) Applicant: HEWLETT PACKARD ENTERPRISE DEVELOPMENT LP, Houston, TX (US)

(72) Inventors: Catherine Graves, Milpitas, CA (US); Giacomo Pedretti, Cernusco sul Naviglio (IT); Sergey Serebryakov, Saint-Petersburg (RU); John Paul Strachan, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 201 days.

(21) Appl. No.: 17/555,260

(22) Filed: Dec. 17, 2021

(65) Prior Publication Data

US 2023/0197151 A1 Jun. 22, 2023

(51) Int. Cl.
*G11C 15/04* (2006.01)
*G11C 13/00* (2006.01)
*G06N 7/01* (2023.01)

(52) U.S. Cl.
CPC .............. *G11C 13/004* (2013.01); *G06N 7/01* (2023.01); *G11C 13/0026* (2013.01); *G11C 13/0028* (2013.01); *G11C 13/0069* (2013.01); *G11C 15/04* (2013.01)

(58) Field of Classification Search
CPC ... G11C 13/00; G11C 13/0002; G11C 13/004; G11C 13/0026; G11C 13/0028; G11C 13/0069
See application file for complete search history.

(56) References Cited

U.S. PATENT DOCUMENTS

2020/0258587 A1* 8/2020 Li .................... G11C 15/046

* cited by examiner

*Primary Examiner* — Alfredo Bermudez Lozada
(74) *Attorney, Agent, or Firm* — Sheppard Mullin Richter & Hampton LLP

(57) ABSTRACT

Systems and methods are provided for employing analog content addressable memory (aCAMs) to achieve low latency complex distribution sampling. For example, an aCAM core circuit can include an aCAM array. Amplitudes of a probability distribution function are mapped to a width of one or more aCAM cells in each row of the aCAM array. The aCAM core circuit can also include a resistive random access memory (RRAM) storing lookup information, such as information used for processing a model. By randomly selecting columns to search of the aCAM array, the mapped probability distribution function is sampled in a manner that has low latency. The aCAM core circuit can accelerate the sampling step in methods relying on sampling from arbitrary probability distributions, such as particle filter techniques. A hardware architecture for an aCAM Particle Filter that utilizes the aCAM core circuit as a central structure is also described.

20 Claims, 9 Drawing Sheets

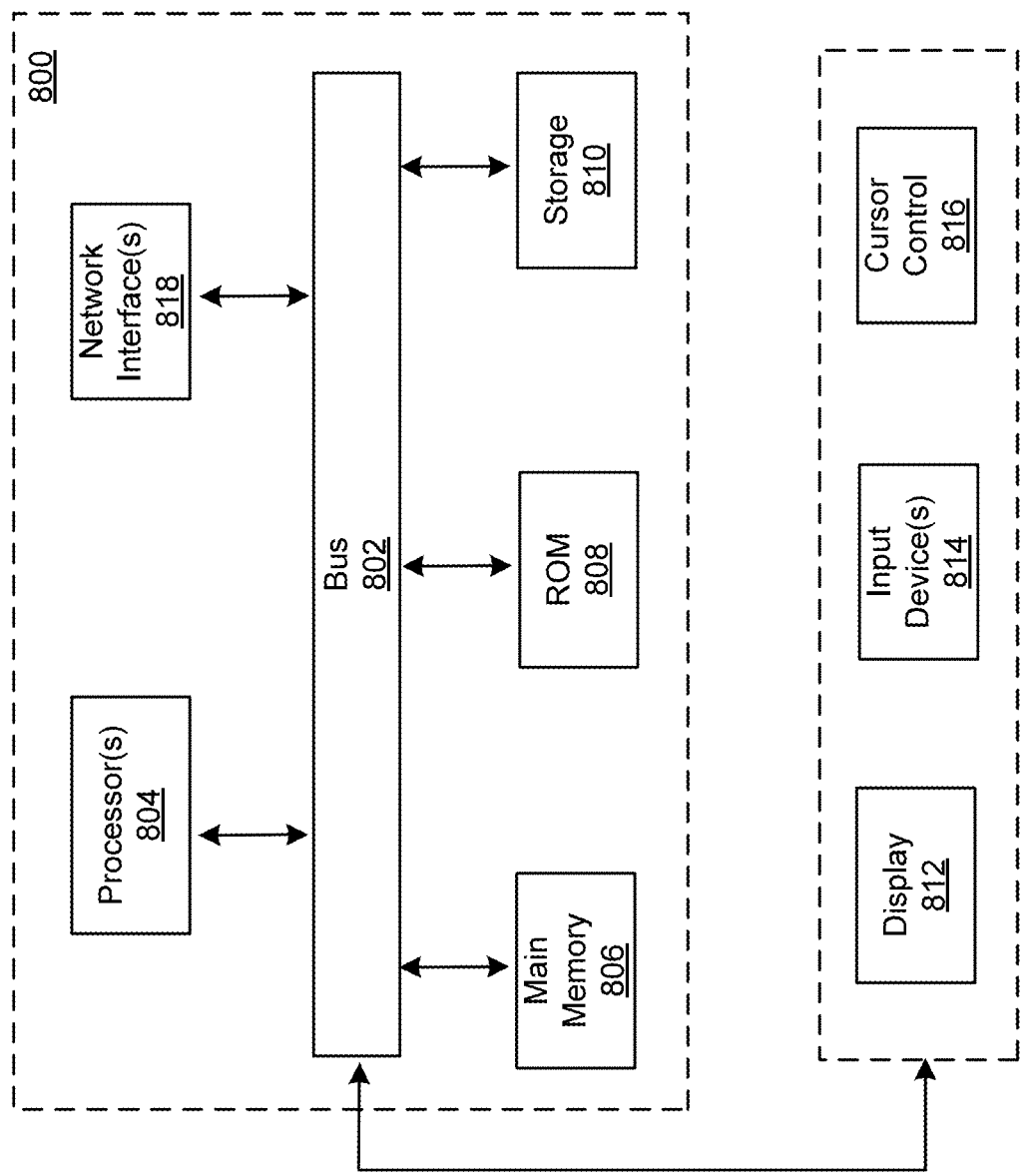

US 11,881,261 B2

CAMS FOR LOW LATENCY COMPLEX DISTRIBUTION SAMPLING

BACKGROUND

Content addressable memory ("CAM") is a type of computing memory in which the stored data is not accessed by its location but rather by its content. A word, or "tag", is input to the CAM, the CAM searches for the tag in its contents and, when found, the CAM returns the address of the location where the found contents reside. CAMs are powerful, efficient, and fast. However, CAMs are also relatively large, consume a lot of power, and are relatively expensive. These drawbacks limit their applicability to select applications in which their power, efficiency, and speed are sufficiently desirable to outweigh their size, cost, and power consumption.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 8 illustrates an example computing system that may be used to implement various features of embodiments described in the present disclosure.

Figure 1:
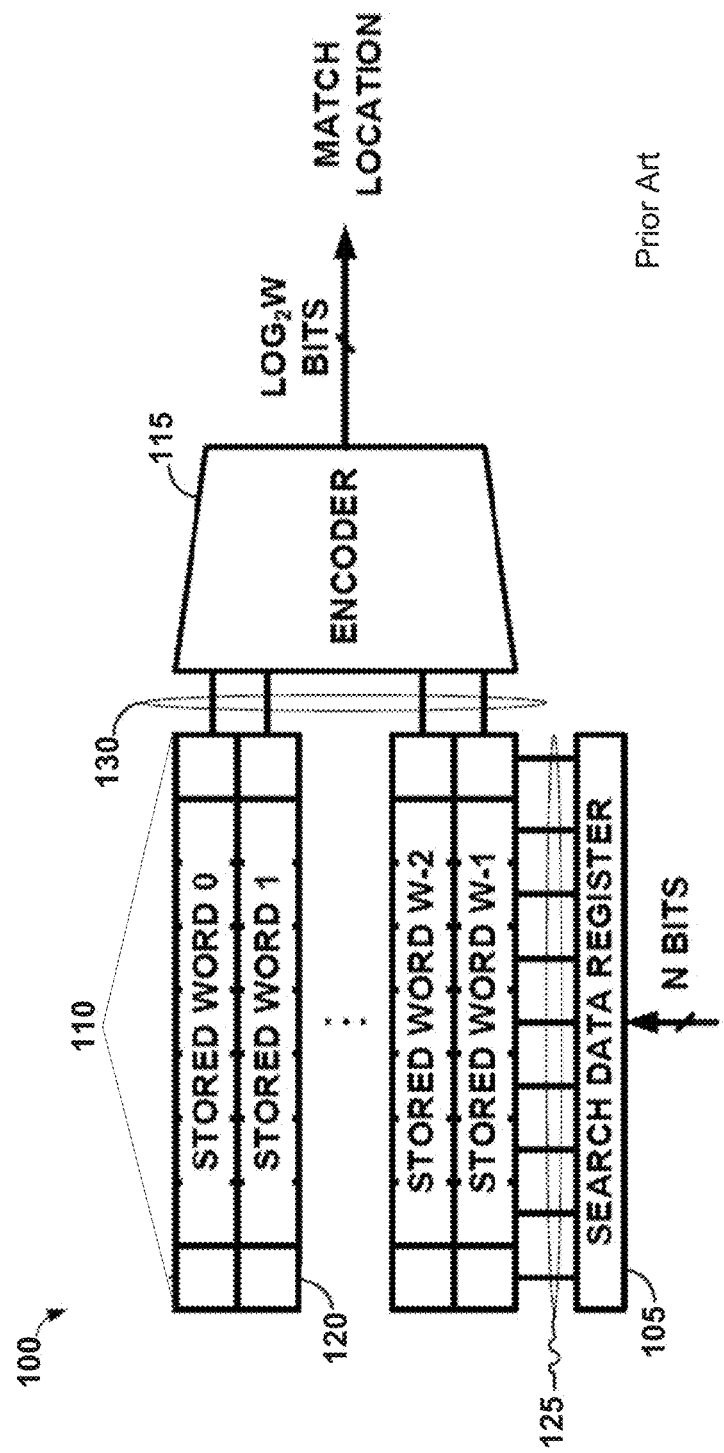
FIG. 1 conceptually depicts an analog content addressable memory ("aCAM"), in accordance with the disclosure.

The figures are not exhaustive and do not limit the present disclosure to the precise form disclosed.

DETAILED DESCRIPTION

Content addressable memory ("CAM") is a hardware that compares input patterns against its stored data. The memory that stores the data in the CAM also performs the search operation at the same location, eliminating the expensive data transfer between different units in conventional hardware. During the search, all the memory cells are operating in parallel, which leads to massive throughput with applications in real-time network traffic monitoring, access control lists ("ACL"), associative memories, etc.

CAMs can be implemented in technologies that permit the CAM to hold its contents even when power is lost or otherwise removed. Thus, a CAM's data "persists" and can act as what is known as a "non-volatile memory". These technologies include, for instance, resistive switching memory (i.e. memristor), phase change memory, magnetoresistive memory, ferroelectric memory, some other resistive random-access memory device, or combinations of those technologies.

CAMs can be categorized as "binary" or "ternary". A binary CAM ("BCAM") operates on an input pattern containing binary bits of "0" and "1". A ternary CAM ("TCAM") operates on an input pattern (and stores data) containing not only binary bits of "0" and "1", but also an "X" value. An "X" is sometimes referred to as a "don't care" or a "wildcard". In a search on the input pattern in a TCAM, an "X" will return a match on either a "0" bit or a "1". Thus, a search on the input pattern "10×1" will return a match for both "1001" and "1011". Note that both BCAMs and TCAMS use and operate on binary values of "0" and "1". CAMs are digital in that the data are stored in the CAM as binary values in a memory (e.g., SRAM, memristor, etc.) and the input patterns are represented by binarized logic '0's and '1's. Each memory cell in the CAM processes one value at a time (either 0/1 or 0/1/X), which limits the memory density and the power efficiency.

The present disclosure provides an analog CAM ("aCAM") circuit that searches multilevel voltages and stores analog values in a nonvolatile memory (e.g., memristor). One analog cell can implement a function that is equivalent to multiple digital CAM cells, leading to significant advantages in area and power saving in implementing certain CAM-based functions. The aCAM circuit can be driven with standard multi-level digital values, or directly with analog signals, giving additional potential for increased functionality while removing the need for expensive analog-digital conversion. More particularly, an aCAM cell outputs a match when the analog input voltage matches a certain range that is defined by the aCAM cell.

Furthermore, an in-memory computation hardware accelerator that provides low latency sampling from arbitrary probability distributions of any complexity, is implemented in accordance with the disclosed embodiments. Arbitrary probability distributions are a common component in many probabilistic computing methods. One such type of probabilistic computing method that is well-known in the realm of statistics is Markov chain Monte Carlo (MCMC). Particularly, the aforementioned aCAM circuit can be distinctly leveraged in order to build CAMs that are larger and lower power than those implemented with purely digital static random-access memory (SRAM)-based circuits. Thus, the disclosed hardware architectures can yield both area savings and power savings in CAMs, thereby allowing large probability distributions to be implemented in this hardware.

The potential of AI to deliver smarter and more intuitive answers continues to increase. Further, the rise of interest in 'explainable' Artificial Intelligence (AI) models has led to a resurgence of probabilistic computing and Markov chain Monte Carlo (MCMC) methods, as these approaches can incorporate domain knowledge, provide confidence bounds, and are naturally inspectable.

As background, a barrier in developing improved AI technology involves the unstructured and "noisy" characteristics of the natural data that is fed to a computer. Making computers efficient at dealing with probabilities at scale is paramount to transforming current AI-based systems and applications from computational aids into sources of intelligent decision-making. Thus, probabilistic computing is a key component to AI and central to addressing these challenges. Probabilistic computing can allow future systems to comprehend and compute, even with the uncertainties that are inherent in natural data, which will enable computers to be developed that are capable of efficient understanding, predicting and decision-making. However, some methods that employ arbitrary probability distributions (which are also used to drive probabilistic computing), such as MCMC methods, are computationally expensive. For example, MCMC methods may require a large number of samples (or particles) from complex distributions and intermediate calculations for accurate results, which limits their applicability.

A key concept for the disclosed embodiments is that it is possible to map arbitrary probability distributions (used for probabilistic computing) to aCAM hardware. Also, a hardware architecture, for instance implementing MCMC use cases, can be built around the aCAM core for high parallelism. As disclosed herein, aCAM circuits are particularly utilized to accelerate the sampling step in methods relying on sampling from arbitrary probability distributions. Additionally, a distinct mapping scheme for arbitrary distributions to be successfully mapped to aCAMs is described. This mapping scheme can yield an in-memory computing of the sampling step. As a result, the disclosed embodiments can enable higher speed complex distribution sampling with aCAMs, and achieve comparable model accuracy, even in cases with reduced aCAM precision.

An aCAM, in accordance with the present disclosure, can match all values between a "high value" and a "low value", or within a range, where the range includes non-binary values. These high and low values are set by programming memristors, and so are referred to as "$R_{high}$" and "$R_{low}$" herein. $R_{high}$ and $R_{low}$ set bounds of the range of values that may be stored in the cell such that the cell may store analog values. A memory cell in an aCAM may store any value between the value defined by $R_{high}$ and the value defined by $R_{low}$. If $R_{high}=R_{max}$, where $R_{max}$ is the maximum resistance of a memristor, and $R_{low}=R_{min}$, where $R_{min}$ is the minimum resistance of a memristor, then the stored value is an "X", as in a Ternary CAM. The number of equivalent digital cells or bits that can be stored in an analog CAM cell depends on the number of states the programmable resistor can be programmed to. To be able to encode the equivalent of n bits (i.e., n binary CAM/TCAM cells), the programmable resistor has $2^n+1$ states.

Thus, a memristor-based aCAM can search analog voltages. The memristor-based aCAM can also store analog values as the value(s) of resistance which fall in between $R_{low}$ and $R_{high}$ which are set by the multilevel resistance of the memristors. (A memristor-based aCAM may also search and store digital values.) One example of an aCAM includes a plurality of cells arranged in rows and columns. Each cell performs two analog comparisons: 'greater than' and 'less than' to the searched data line voltage at the same time, with significantly reduced processing time and energy consumption comparing to its digital counterpart. The aCAM can be driven with standard multi-level digital values or directly with analog signals in various examples. This provides additional potential for increased functionality when removing the need for expensive analog-digital conversion. The significant power saving of the proposed memristor aCAM enables the application of CAMs to more generalized computation and other novel application scenarios.

Turning now to the drawings, the aCAM disclosed herein may be used in digital applications to perform traditional TCAM functions and operations as well as in analog applications. FIG. 1, discussed further below, illustrates one particular example of a digital application of the aCAM.

Referring now to FIG. 1, an example of a CAM is illustrated. As a general description, CAMs are hardware that compare input patterns against its stored data. The memory that stores the data in the CAM also performs the search operation at the same location, eliminating expensive data transfer between different units in conventional hardware. During the search, all memory cells are operating in parallel, which can lead to massive throughput with applications in real-time network traffic monitoring, access control lists (ACL), associative memoires, and the like.

CAMs can be implemented in technologies that permit the CAM to hold its contents, even when power is lost or otherwise removed. Thus, a CAM's data "persists" and can act as a "non-volatile memory." These technologies include, for instance, resistive switching memory (i.e., memristor), phase change memory, magnetoresistive memory, ferroelectric memory, some other resistive random-access memory device, or combinations of those technologies.

CAMs can be categorized as "binary" or "ternary." A binary CAM (BCAM), operates on an input pattern containing binary bits of "0" and "1". Additionally, a TCAM operates on an input pattern (and stores data) containing not only binary bits of "0" and "1", but also an "X" value. An "X" is sometimes referred to as a "don't care" or a "wildcard". In a search on the input pattern in a TCAM, an "X" will return a match on either a "0" bit or a "1" bit. Thus, a search on the pattern "10x1" will return a match for both "1001" and "1011". Note that both BCAMs and TCAMs use and operate on binary values of "0" and "1". CAMs are digital in that the data are stored in the CAM as binary values in a memory (e.g., SRAM, memristor, etc.) and the input patterns are represented by binarized logic '0's and '1's. Each memory cell in the CAM processes one value at a time (either 0/1 or 0/1/X), which limits the memory density and power efficiency.

Referring back to FIG. 1, an example of a CAM 100 that can implement the searching techniques and features disclosed herein is illustrated. The CAM 100, shown in the illustrated example, can be used in a digital application in which search patterns and the values stored in the CAM 100 are digital.

The CAM 100 can include a search data register 105, an analog memory cell array 110, and an encoder 115. The analog cell array 110 stores W "stored words" 0 through W−1. Each stored word is a pattern values, at least some of which may be analog values as described below. The search data register 105, in use, may be loaded with an analog or binary input pattern that can be searched from among the contents of analog cell array 110. The example of FIG. 1 operates on a binary input pattern as indicated by the 'N bits' going to the data line register. An example operating on an analog search pattern is discussed further below. Thus, instead of needing to store two bits of data in two columns as in the case for a digital CAM, one column of an analog CAM can encode four values.

The analog cell array 110 includes a plurality of analog cells 120 (only one is indicated in FIG. 1) arranged in rows and columns. A configuration for the analog cells 120 within the CAM is more prominently shown and described in further detail in reference to FIG. 2. During a search, the analog input pattern loaded into the search data register 105 is communicated to the analog cell array 110 over a plurality of search lines 125. Some examples may use data lines in addition, or in lieu, of search lines. Each cell 120 then indicates whether a value of the analog input pattern is matched by a ranged of values contained in the cell (e.g., the range of values including non-binary values).

The indications of whether the cells contain matches are communicated to the encoder 115 over a plurality of match lines 130. Note that a match is found if the searched word (or pattern) matches the stored word within a single row. The match lines do not output the matches of individual cells, but whether the stored row word matches the searched data (row). More particularly, that match lines 130 are pre-charged high along rows, data is searches on search lines 125 (or data lines) along columns, and if a mismatch between searched and stored content occurs, the 130 discharges and goes low. If a match occurs, the match line 130 stays high.

The encoder 115 is a priority encoder that returns a match location with the analog cell array 110. Note that the encoder 115 may be omitted in some examples, particularly in examples in which multiple match locations are identified and desired. For instance, because the "don't care" values may be included in the input pattern, multiple matches among the W stored words may be found. Some examples might wish to identify more than one, or even all, match locations and these examples would omit the encoder 115.

Figure 2A:
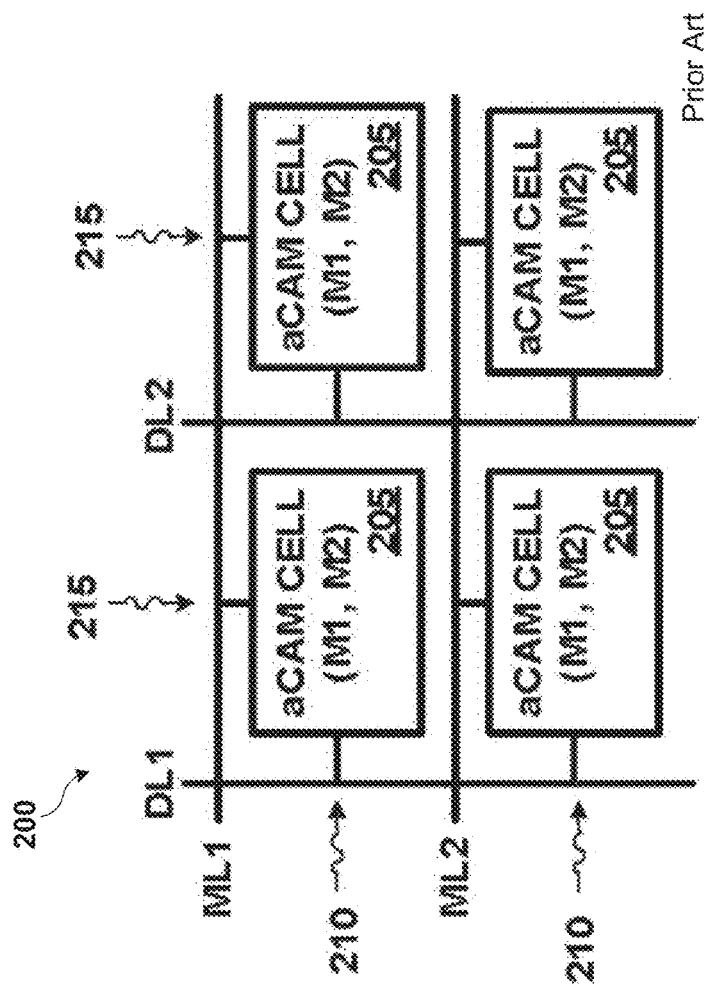
FIG. 2A illustrates an example aCAM cell array, and can be comprised by aCAMs, such as the aCAM depicted in FIG. 1, according to some embodiments.

FIG. 2A illustrates selected portions of an analog cell array 200 of aCAMs, such as the aCAM 100 in FIG. 1, in one particular example. The aCAM cells 205 are arranged in rows 210 and columns 215 and are each individually searchable over the data lines DL1, DL2. Whether a match is found from data on DL1 and DL2 and the data stored in the rows by each aCAM cell's M1 and M2 programmed values is indicated over the match lines ML1, ML2. As those in the art having the benefit of this disclosure will appreciate, an analog cell array 200 will typically be larger than a 2×2 array. The precise size will be implementation specific. The 2×2 portion is shown for illustrative purposes and is not limiting.

Each aCAM cell 205 includes two memristors M1, M2 (not separately shown) that are used to define the range of values stored in the respective aCAM cell 205. FIG. 2A conceptually illustrates a resistance differential that may be used to set the stored analog value or range of the aCAM cells 205 in FIG. 2 in some examples. The total range of resistance R that may be implemented by both memristors M1, M2 is defined by a maximum resistance $R_{max}$ and a minimum resistance $R_{min}$. A range of resistance $R_{range}$ is defined by $R_{high}$ and $R_{low}$. $R_{high}$ is determined by programming a value in M1 and $R_{low}$ is determined by programming a value in M2. When an analog value is stored, the analog number is encoded in the cell via two resistance thresholds, a high and a low resistance threshold within which the analog value of the cell (or range value) resides. Several electronic circuits by which the aCAM cells 205 may be implemented will be discussed further below.

As discussed above, the present disclosure may encode more than three levels in a content addressable memory. In a memristor CAM, the information is ultimately mapped to resistance levels and there are $2^n+1$ distinct resistance levels between $R_{low}$ and $R_{high}$. That is, $R_{range}=R_{high}-R_{low}$ and includes $2^n+1$ distinct resistance levels, each distinct resistance level representing a different value. For example, where $R_{high} \neq R_{low}$ and $R_{high} > R_{low}$, then the aCAM cell 205 stores all levels between $R_{low}$ and $R_{high}$. For another example, if $R_{high}=R_{max}$ and $R_{low}=R_{min}$, then the aCAM cell 205 stores an X=do not care value. For yet another example, if $R_{high}$=a resistance $R_1$ and $R_{low}=R_1$-delta where delta= $(R_{max}-R_{min})/(2^n)$, then the aCAM cell 205 stores the single level $R_1$.

Figure 2B:
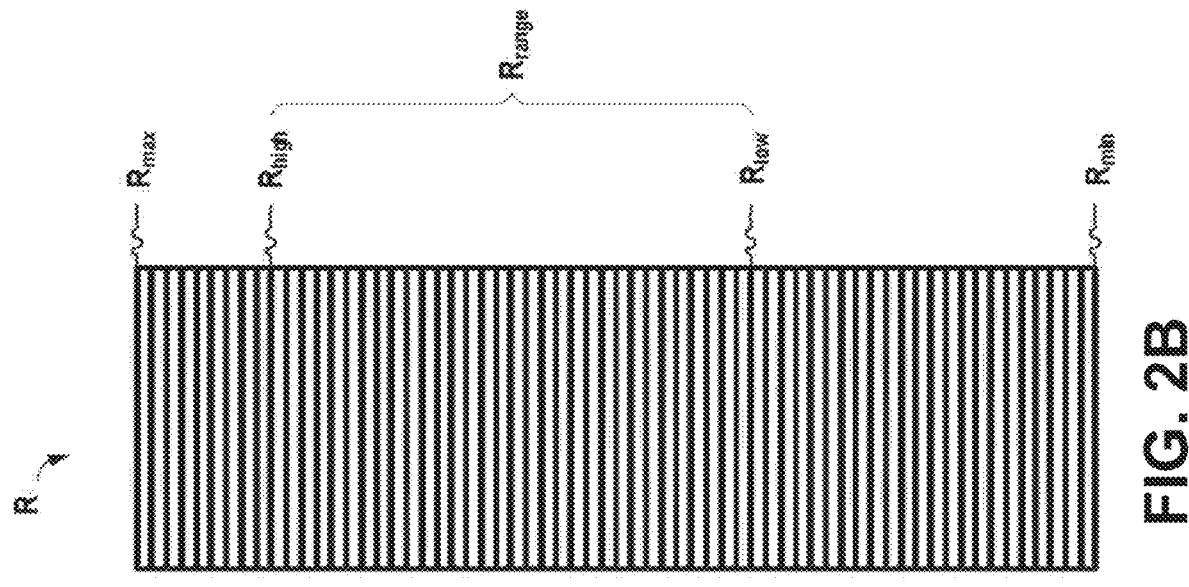
FIG. 2B is a conceptual diagram of an example range of voltages (e.g., variance range) that can be implemented by the analog CAM cell, as shown in FIG. 2A, to perform search operations, according to some embodiments.
Figure 3A:
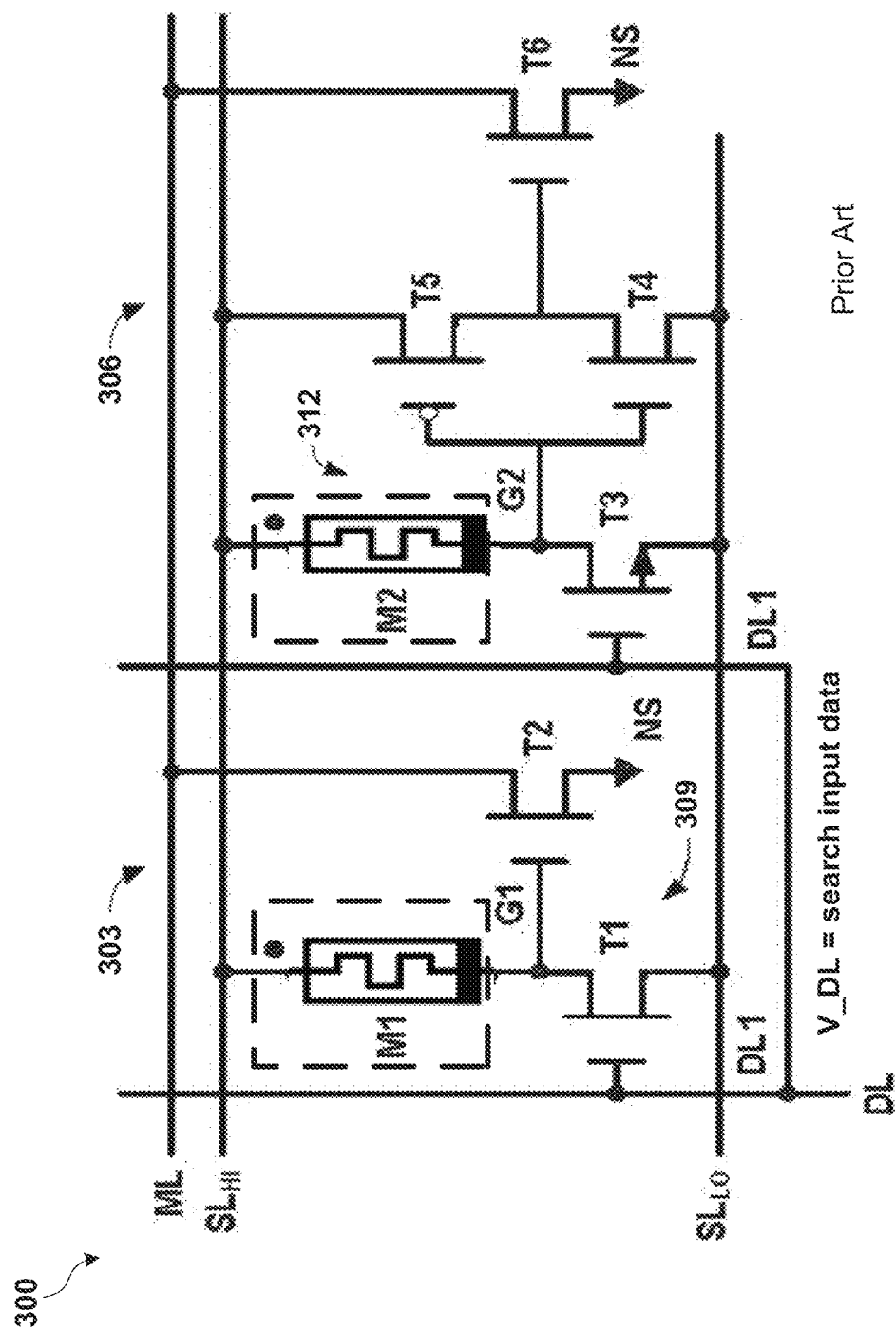
FIG. 3A depicts an example configuration for a circuit implementing an aCAM cell of FIG. 2A, according to some embodiments.

FIG. 3A depicts an electronic circuit implementing an aCAM cell 300 that may be used to implement the aCAM cells 205 of FIG. 2 in some examples. As a general description, the aCAM cell 300 acts as an "analog TCAM" cell that searches an analog voltage range. A Match Line (ML) is first pre-charged to a high voltage. An input to DL1 and DL2 is then applied, which will eventually discharge the ML if the input is out of the analog voltage range encoded in the aCAM cell. The matching analog voltage range is defined as the conductance of non-volatile memristors, where M2 defines the lower voltage bound and M1 defines the upper voltage bound.

The aCAM cell 300 includes a "high side" 303 and a "low side" 306, so-called because the memristor M1 and the memristor M2 are programmed to determine the values of $R_{high}$ and $R_{low}$, respectively. The high side 303 includes a first transistor T1 and a first memristor M1. The first memristor M1, in conjunction with the first transistor T1, defines a first voltage divider 309 and, when programmed, defines a high value $R_{high}$ of a range of values $R_{range}$. The high side 303 also includes a second transistor that, in use, indicates whether a searched value matches the high value $R_{high}$ as discussed further below. The low sides 306 includes a third transistor T3 and the second memristor M2. The second memristor M2, in conjunction with the third transistor T3, defines a second voltage divider 312. When the second memristor M2 is programmed, the memristor M2 defines the low value $R_{low}$ of the range of values $R_{range}$. The low side 306 also includes another transistor T6 that, in use, indicates whether the searched value matches the low value $R_{low}$.

In the example of FIG. 3A, the inputs can be tied together, so that T1/M1 and T3/M2 are equivalent, but T4/T5 form an inverter. Thus, the left side and right side are defining the high and low side independently. Note that, although the T4/T5 inverter is in the low side 306 in the illustrated example, it may be implemented in the high side 303 in other examples.

The aCAM cell 300 also includes a match line ML, search lines $SL_{HI}$, $SL_{LO}$ and data lines DL, DL1. As noted above, the memristor-transistor pairs M1/T1 and M2/T3 define a respective voltage divider 309, 312. The voltage dividers 309, 312 are used to encode $R_{high}$ and $R_{low}$ when the memristors M1, M2 are programmed. Thus, in this example, in each memristor-transistor pair M1/T1 and M2/T3, the analog search is implemented as the gate voltage of the transistor to create a variable-resistor divider with the memristors programmed to an analog (stored) value.

More particularly, memristor M1 and transistor T1 form a voltage divider 309, in which M1 is a memristor with tunable non-volatile resistance and T1 is a transistor whose resistance increases with the input voltage on the data line DL. Therefore, there exists a threshold voltage, dependent on the M1 resistance, that when the data line DL input voltage is smaller than the threshold, the pull-down transistor T2 turns on which pulls down the match line ML yielding a 'mismatch' result. Similarity, memristor M2 and transistor T3 form another voltage divider 312, and the internal voltage node is inverted by the transistors T4, T5 before applying to another pull-down transistor T6. As a result, with properly programmed resistances in the memristors M1, M2, the aCAM cell 300 keeps the match line ML high only when the voltage on the data line DL is within a certain range defined by M1 and M2 resistances.

Still referring to FIG. 3A, the search result is therefore sensed as the voltage level on the ML, which is pulled down when the gate voltage of the pull-down transistor T1, T3 exceeds its threshold voltage ($V_{th}$). Voltage on G1 ($V_{G1}$) decreases with $V_{DL}$. Therefore, a lower bound voltage ($V_{lo}$) exists, which is configurable by the corresponding memristor conductance, that when the $V_{DL}$ is smaller than $V_{lo}$, $V_{G1}$ is larger than the $V_{th}$ of the pull-down transistor, causing the match line ML to be pulled down for a 'mismatch' result. Similarly, voltage on G2 ($V_{G2}$) increases with $V_{DL}$, and therefore the upper bound voltage is configured by another memristor conductance in the same aCAM cell 300. Combining the two parts, the search voltage upper and lower range (i.e. the search voltage range) is configured with the two memristor conductances in one aCAM cell.

The pre-charging of the match line ML can be initiated by enabling a pre-charging peripheral (not shown in FIG. 6). The data lines DL are asserted in conjunction with the match line ML pre-charge while $SL_{HI}$ is kept low. The search is started by asserting $SL_{HI}$. A transient voltage response on the ML with a search range can be defined in the memristors. The search result sensed from the match line ML after initiating the search shows that the aCAM cell 600 outputs a match when the voltage on the data line DL falls within a predefined range defined by the memristor conductances given by G(M1) and G(M2) where conductance is the inverse of resistance. The gate voltage $V_{G1}$ at G1 in FIG. 6 of the pull-down transistor T2 drops to a voltage below its threshold with increasing data line DL voltage. The gate voltage $V_{G2}$ at G2 in FIG. 6 of the pull-down transistor T6 increases to a voltage above its threshold with increasing data line DL voltage. The cut-off data line DL voltage for a lower and upper bound of a matched search increases with the corresponding memristor conductance.

Figure 3B:
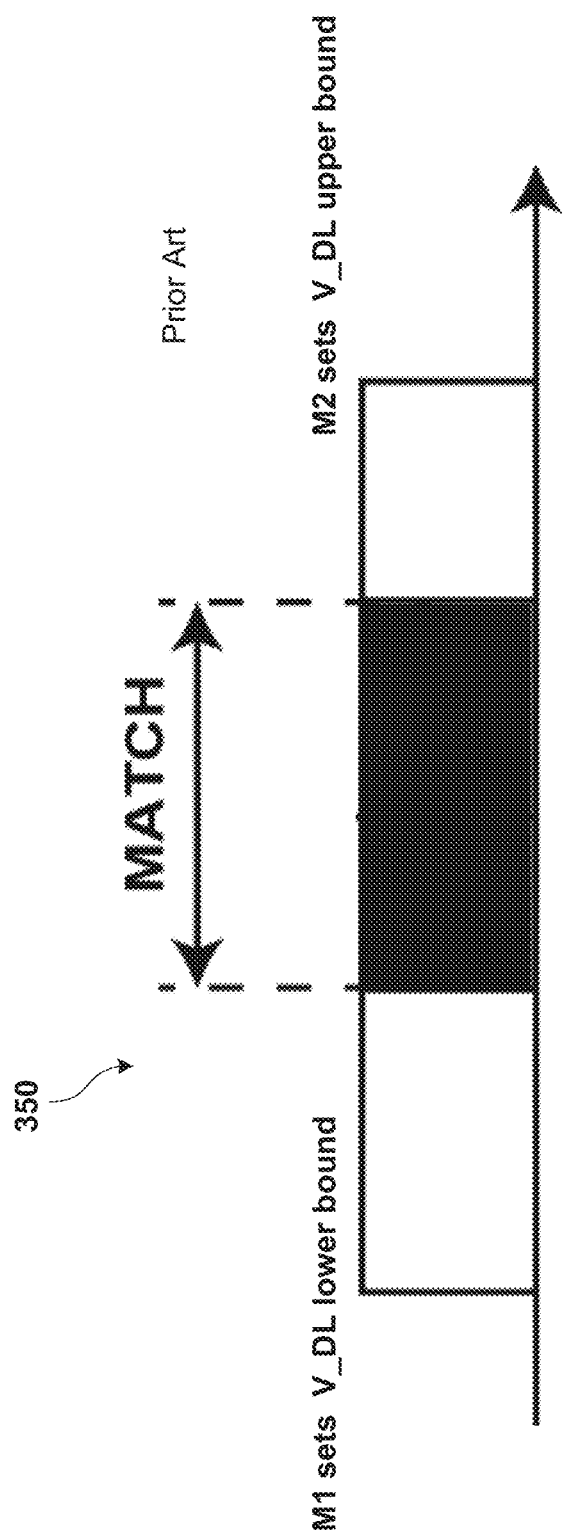
FIG. 3B is a conceptual diagram of a lower bound and an upper bound for search parameters that can be programed into the aCAM cell shown in FIG. 3A, according to some embodiments.

An aCAM cell can search analog voltages and stores analog values as the value(s) which fall in within an analog voltage range. FIG. 3B is a conceptual diagram, in order to depict that M1 sets an analog value that defines the lower bound ($V\_DL_{lowerbound}$) portion of the search parameters, and M2 sets the analog value that defines the upper bound ($V\_DL_{upperbound}$) portion of the search parameters that can be programed into the aCAM cell shown in FIG. 3A. In the example, the shaded portion of bar 350 represents a width, which is the range of voltages that are encoded in aCAM cell. As described above, the width (represented by the shaded portion of bar 350) can include a range of analog voltage values, having an upper limit of an upper voltage level that is set by M2. Also, the width (represented by the shaded portion of bar 350) can include a range of analog voltage values, having a lower limit that is defined by a lower voltage level that is set by M1. Accordingly, for a search against the analog value stored by aCAM cell (shown in FIG. 2) to result in a match, the voltage (V_DL) applied on data line DL (representing the search input data) must be a voltage value that falls within the range of voltage values defined by these limits (e.g., $V\_DL_{lowerbound} \leq V\_DL \leq V\_DL_{upperbound}$ or inside of the shaded portion of bar 350).

Figure 4:
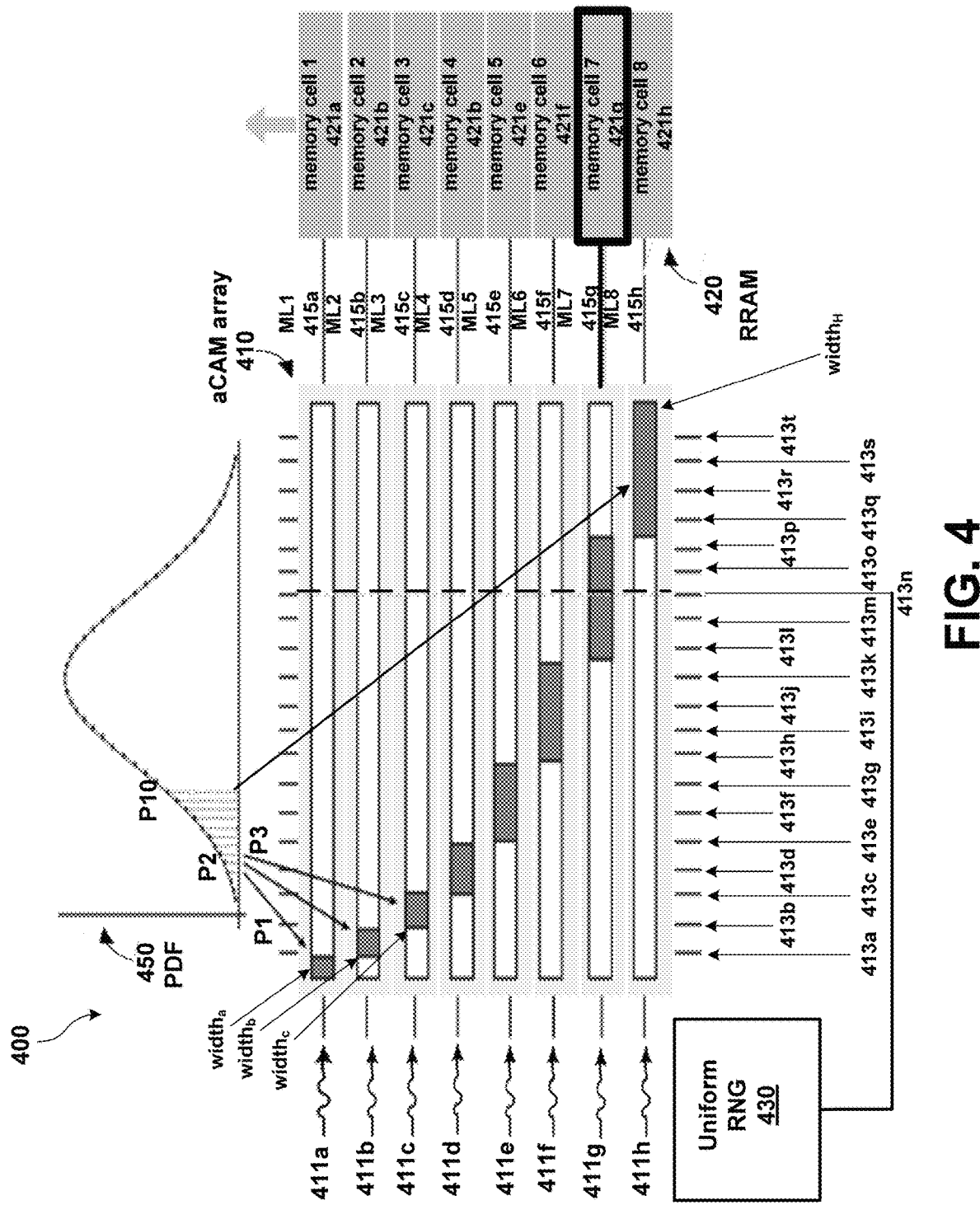
FIG. 4 depicts an example configuration for circuitry implementing an aCAM core circuit for low latency sampling, according to some embodiments.

Referring back to FIG. 3A, the aCAM cell 300 can be configured as a direct digital replacement with multibit storage or with the capability to store arbitrary ranges, which is particularly pertinent to the disclosed embodiments which leverage aCAMs for complex distribution sampling. Moreover, the disclosed aCAM circuit utilizes the matchlines (ML) of aCAM arrays, such as the aCAM array depicted in FIG. 2, to drive a read lookup operation in a connected resistive random-access memory (RRAM) array. This circuit, including an aCAM array coupled to an RRAM array (as shown in FIG. 4), is referred to hereinafter as an "aCAM core circuit." For instance, the aCAM core circuit can serve as the building block, or "core", for more complex hardware designs. For instance, a larger hardware architecture can be built including additional elements operating with an aggregation of multiple aCAM cores circuits for parallelism and increased processing efficiency. The distinct design of the aCAM core circuit, as disclosed herein, enables a low latency direct key value lookup to be achieved.

Referring now to FIG. 4, an example configuration for the aCAM core circuit 400, which can implement the disclosed low latency complex distribution sampling, is shown. In the illustrated example of FIG. 4, the aCAM core circuit 400 can include, but is not limited to: an aCAM array 410 which is configured to store a target probability distribution function; an RRAM block 420 which is configured to store lookup information, such as information used for processing a model; and an uniform random number generator (RNG) 430, which is configured to function as a selector to columns of the aCAM array 410 to effectively sample the stored probability distribution function. In accordance with the embodiments, arbitrary probability distributions (e.g., Gaussian distributions), are mapped to the aCAM array 410. FIG. 4 illustrates that the aCAM array 410 can be implemented as an M×N array of aCAM cells, that are arranged in M number of rows 411a-411h, and N columns. The aCAM array 410 also includes multiple columns lines 413a-413t to the aCAM cells in the rows 411a-411h, where each of the column lines 413a-413t are individually searchable. Particularly in the example of FIG. 4, the aCAM array 410 is implemented as an 8×20 array, where an amplitude (or distribution height) corresponding to a discretized point of a probability distribution is encoded as a populated width of one or more of the aCAM cells within the rows 411a-411h. Restated, an amplitude can be mapped to multiple aCAM cells, spanning a width across multiple columns within a row of the aCAM array 410. Further, the aCAM cells in rows 411a-411h have corresponding match lines (ML1-ML8) 415a-415h. Indications of whether the aCAM cells of the rows 411a-411h contain matches are communicated over the plurality of match lines 415a-415h. Each of the match lines 415a-415h from the aCAM cells in the aCAM array 410 can drive a look up to a corresponding one of the memory cells 421a-421f of the RRAM 420.

As seen, the RRAM 420 can be implemented as a RRAM memory block that includes a column of multiple memory cells (memory cell a—memory cell f) 421a-421f. Each of the memory cells 421a-421f stores lookup information that is relevant to processing a model, such as a state space model or MCMC model. Particularly in the example of FIG. 4, since the probability distribution function is a Gaussian probability distribution (PDF) 450, the RRAM 420 stores state updates (e.g., state update $\sigma_n \eta$) that are utilized to process a MCMC model, for instance. Additionally, the RRAM 420 is shown to have a direct connection to the aCAM array 410. For example, match line (ML1) 415a from the aCAM cell in row 411a drives a lookup into the connected memory cell a 421 in RRAM block 420.

FIG. 4 illustrates an example of a Gaussian PDF 450 that is being mapped to the aCAM core circuit 400. As a general description, FIG. 4 particularly illustrates some discretized points from the Gaussian PDF 410 (e.g., left side of the PDF 410) that are mapped to the aCAM core circuit 400. As previously described, each aCAM cell in the rows 411a-411h has a corresponding width (represented in FIG. 4 by a bar in the row of the aCAM array 410), where a portion of its width can be populated with a range of analog voltage values (represented in FIG. 4 by the shaded portion of bar). Furthermore, a range of analog voltage values may also be mapped across multiple aCAM cells over multiple columns (i.e. multiple cells in a row), such that an amplitude for a single discretized point can be mapped to multiple columns (within the same row) of the aCAM array 410 depending on the aCAM storage capacity and/or accuracy.

As a result, the aCAM cells in each respective row, can have a separate and distinct populated width. In turn, each populated width is encoding a range of values corresponding to an amplitude of the PDF 450 at a certain discretized point in the corresponding one or more aCAM cells. For example, an aCAM cell of row 411a can have a populated width (shown in FIG. 4 as shaded bar "width$_A$") that is different from the populated width corresponding to an aCAM cell of row 411b (shown in FIG. 4 as shaded bar "width$_B$"), and an aCAM cell of row 411c can have its corresponding populated width (shown in FIG. 4 as shaded bar "width$_C$") that is different from the populated widths of the populated aCAM cells of rows 411a and 411b, and so on. Moreover, a populated width for a row can correspond to a sum of individual populated widths of multiple aCAM cells. As illustrated in FIG. 4, row 411h can have a populated width (shown in FIG. 4 as "width$_H$") that is mapped through multiple columns of aCAM cells for that row. That is, a plurality of aCAM cells in row 411h, each has its respective width populated. Ultimately the populated width for row 411h includes the widths for each these individually populated aCAM cells and spans across multiple columns 413q-413t. Accordingly, the disclosed embodiments leverages this feature of aCAMs, and encodes values in one or more aCAM cells of rows 411a-411h that represent a series of different heights along the PDF 450 curve at different discretized points, in manner that effectively stores a representation (e.g., cumulative density function) of the PDF 450 within the aCAM array 410. Consequently, it can be generally stated that the aCAM array 410 stores the probability distribution function 450.

In the example, a first discretized point (P1) from the PDF 450 has an amplitude value that is encoded as the populated width (width$_A$) of the aCAM cell in row 411a. A second discretized point (P2) from the PDF 450 has a corresponding amplitude value that is encoded as the populated width (width$_B$) of the aCAM cell in row 411b. Similarly, a third discretized point (P3) from the PDF 450 has a corresponding amplitude value that is encoded as the populated width (width$_C$) of the aCAM cell in row 411c. This process of populating one or more aCAM cell widths with a corresponding amplitude of the PDF 450 at a discretized point continues until the PDF 450 is uniformly mapped to the rows 411a-411h of the aCAM array 410.

As illustrated, the populated widths of the aCAM cells in the aCAM array 410 are proportional to the amplitude at the associated discretized point. For instance, the distribution height of the PDF 450 at the discretized point P3 is larger than the distribution height of the PDF at discretized point P2, and the distribution height of the PDF 450 at the discretized point P2 is larger than the distribution height of the PDF at discretized point P1. Accordingly, the populated width (width$_C$) of the aCAM cell in row 411c is larger than the populated width (width$_B$) of the aCAM cell in row 411b, and the populated width (width$_B$) of the aCAM cell in row 411b is larger than the populated width (width$_A$) of the aCAM cell in row 411a. Referring to a tenth discretized point (P10) from the PDF 450, in the example this point has a distribution height (i.e., amplitude) that is greater than the previously described points (e.g., P1, P2, P3). Accordingly, the larger distribution height for the tenth discretized point (P10) is encoded to the widths of multiple aCAM cells, as opposed to a single aCAM. The tenth discretized point (P10) from the PDF 450 has an amplitude value that is encoded as the populated width (width$_H$) of multiple aCAM cells, and mapped through columns lines 413q-413t in row 411h of the aCAM array 410.

In some embodiments, the uniform RNG 430 of the aCAM circuit core 400 can be implemented using memristor devices. In operation, for example, the uniform RNG 430 randomly selects one or more of the columns 413a-413t to search within the aCAM array 410, which is storing the PDF 450. Thus, by searching multiple columns within the aCAM array 410 (where at least some of the columns 413a-413t within each of the rows 411a-411h will cause a match against the distribution height of the PDF 450 at a discretized point that is stored within the respective aCAM cell), the uniform RNG 430 essentially performs a sampling of the PDF 450 stored in the aCAM array 410 in a manner that has lower latency than other existing hardware architectures (e.g., FPGA) used for implementing distribution sampling algorithms.

The example of FIG. 4 depicts the uniform RNG 430 selecting to search column 413n. In response to the search on column 413a, a hit is found, as the searched value of column 413n falls within the populated width in row 411g (e.g., width of row 411g including the widths of multiple aCAM cells). The row 411g has a populated width that is encoding the amplitude of the PDF 450 at a particular discretized point, as previously described. The hit against the stored values of populated aCAM cells in row 411g causes the match line (ML 7) 415g which corresponds to the row 411g to drive a lookup of a value that is stored in the directly connected memory cell (memory cell 7) 421g of the RRAM 420. Subsequently, the state update information that is specifically stored within memory cell 412g of RRAM 420 is accessed. Consequently, the aCAM core circuit 400 can process implement a process that performs a particle filter-based likelihood estimation for MCM on state space models.

Referring back to MCMC, various methods for MCMC comprise a class of algorithms for sampling from a probability distribution. In particular, MCMC can be useful for sampling from an un-normalized probability distribution. Generally, the more steps that are included in the MCMC process, the more closely the distribution of the sample matches the actual desired distribution. By constructing a State Space Model (SSM), for example the SSM 600 shown in FIG. 6A, that has the desired distribution as its equilibrium distribution, one can obtain a sample of the desired distribution. SSM refers to a class of probabilistic graphical models that describe the probabilistic dependence between the latent state variable and the observed measurement. The state or the measurement can be either continuous or discrete. The objective of state space modeling is to compute the optimal estimate of the hidden state given the observed data. The SSM 600 includes inputs x 601 and observations y 602. A goal can be to deduce the underlying model parameters θ. Also, an objective of state space modeling can be to compute the optimal estimate of the hidden state given the observed data. A posterior probability distribution (or density) related to the SSM 600 may be unknown, and can be represented mathematically as:

$$P(\theta|y) = \frac{P(\theta)P(y|\theta)}{P(y)} \quad (1)$$

where y is observations,
θ is model parameters,
P(θ|y) is posterior distribution
P(θ) is prior
P(y|θ) is likelihood
P(y) is normalizing constant Particle Filters (PF), or sequential Monte Carlo methods, can be used to estimate densities used for inferring the hidden state sequence of SSMs given an observation sequence, and easily work with non-Gaussian and non-linear models. While powerful, PFs can be computationally intensive which can limit their use for large, complex models and/or real-time applications. Furthermore, PFs estimate the density with M particles and each step t in the sequential data (often time), where the algorithm for PF consists of three main stages: (1) sampling; (2) weighting; (3) resampling.

Figures 6A, 6B:
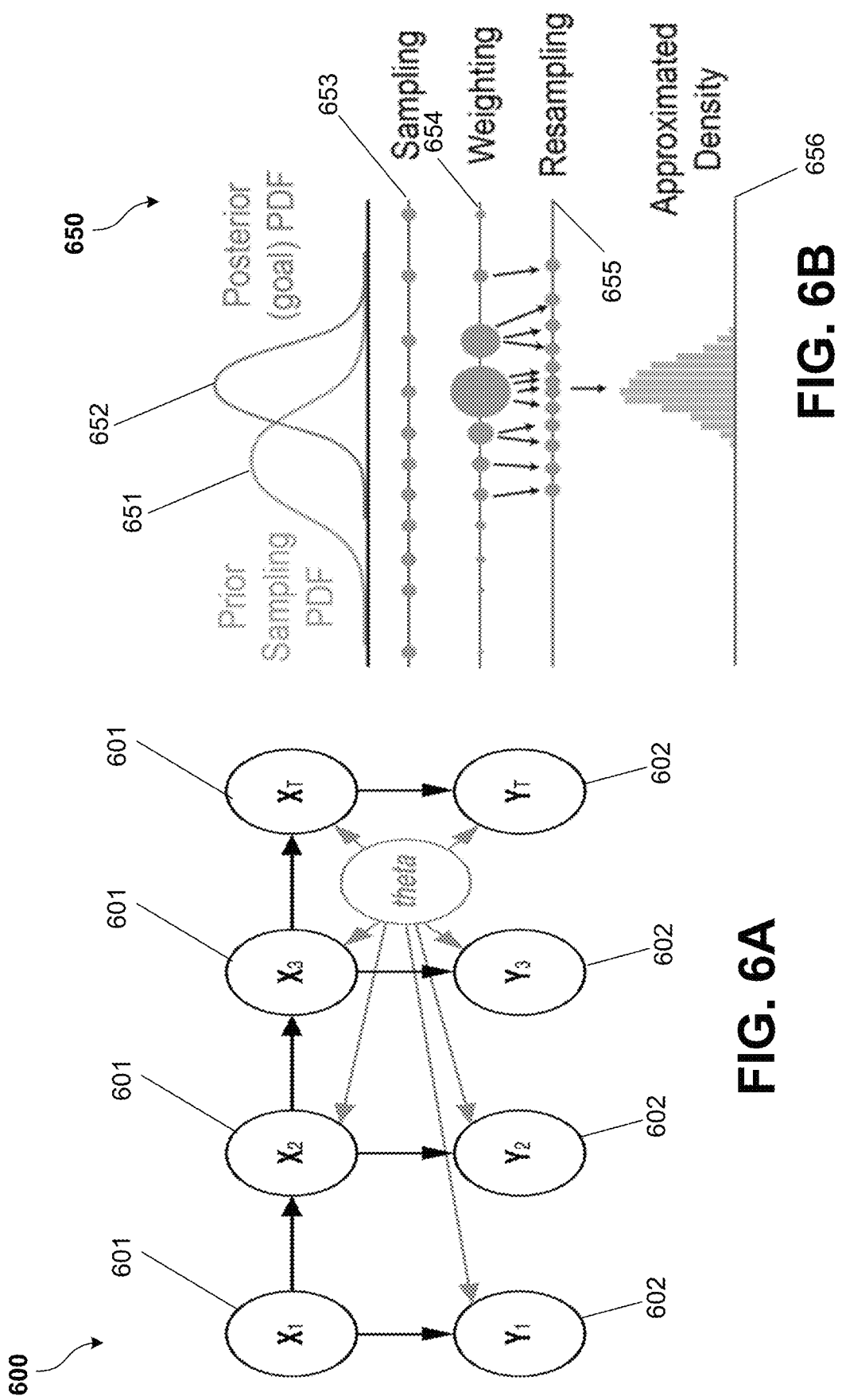
FIG. 6A depicts an example of a state space model (SSM) that is employed by Markov chain Monte Carlo (MCMC) sampling, according to some embodiments.
FIG. 6B depicts an example of a Particle Filter technique that is implemented by the aCAM Particle Filter shown in FIG. 5, according to some embodiments.

FIG. 6B depicts a conceptual diagram 650 of the PF method. The first stage in the PF method involves sampling 653. Using a previous state and a stochastic transition model (specified as probability distribution), sample new hidden state for each particle. In step (t=0), initialize by sampling from some known distribution, shown in FIG. 6B as the prior sampling PDF 651. The posterior PDF 652 is unknown, and is the goal to estimate via the PF techniques. The second stage in the PF method is weighting 654, for instance likelihood or importance weighting. For each particle, a likelihood of an observation given a hidden state is computed. The third stage in the PF method is resample 655. In order to resample particles, M new hidden states can be selected by resampling with replacement using likelihood values as weights. This resampling step is critical to prevent particles with low likelihoods from evolving in the chain. Thus, by applying the PF method to a prior sampling of a probability density function, an approximated density 656 can be derived, where the approximated density function estimates the posterior PDF 652.

Figure 5:
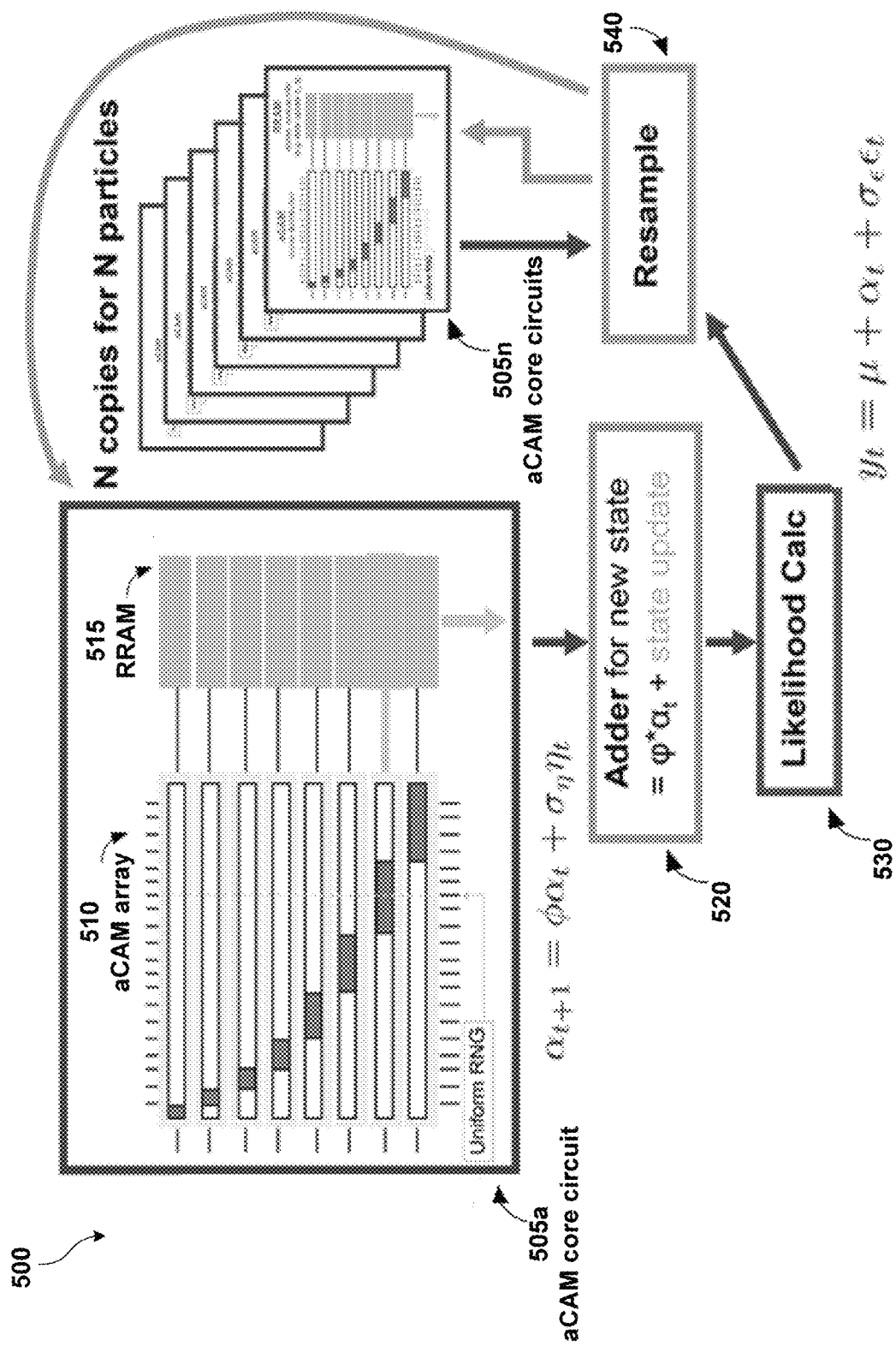
FIG. 5 depicts an example configuration for a hardware architecture, including the aCAM core circuit shown in FIG. 4, implementing an aCAM Particle Filter, according to some embodiments.

Sampling from distributions is a common computational need in many probabilistic computing approaches, such as the PF method described above. While powerful, these techniques are currently limited in their domain applicability due to high computational cost. By leveraging the aCAM core circuit (shown in FIG. 4) to perform low latency sampling of arbitrary probability distributions, sampling techniques can be more efficient, and thus more suitable to be deployed for broader, real-time applications and for more complex models (e.g. in engineering problems, deep neural networks, etc.). As an example, FIG. 5 illustrates an example of a hardware architecture for an aCAM Particle Filter 500 that utilizes the aCAM core circuit 400 as a central structure. The aCAM Particle Filter 500 is an example of a deployment that implements a more complex model, specifically implementing the aforementioned particle filtering techniques.

In FIG. 5, the aCAM Particle Filer 500 is configured to implement MCMC to sample from probability distributions, and then estimate densities of unknown quantities using the PF techniques, described in detail above in reference to FIG. 6B. For example, the three stages of the PF method, as alluded to above, are each implement by a hardware segment of the aCAM Particle Filter's 500. As seen in FIG. 5, the hardware architecture of the aCAM Particle Filer 500 include: an aCAM core circuit 505a; an adder 520; a likelihood calculator 530; a resampler 540; a plurality of additional aCAM core circuits 505n. The aCAM core circuit 505a has the same structure and function as the aCAM core circuit that is described in detail previously in reference to FIG. 4. Thus, for purposes of brevity, the elements and function of aCAM core circuit 505a are not described again in detail with respect to FIG. 5.

Particularly, the aCAM array 510 of the aCAM core circuit 505a is configured to store a unit Gaussian distribution. Alternatively, in some embodiments, the aCAM array 510 of the aCAM core circuit 505a can store arbitrary PDFs. The RRAM 515 is configured to store state evolution information relating to the given model. For example, the RRAM 515 stores state evolution $\sigma^\eta \eta_t$ for $\alpha_{t+1}$, that is represented mathematically as:

$$y_t = \mu + \alpha_t + \sigma_\epsilon \epsilon_t \quad (2)$$

$$\alpha_{t+1} = \phi \alpha_t + \sigma_\eta \eta_t \quad (3)$$

The adder 520 and the likelihood calculator 530 can then use the sampling information and the state update information from the aCAM core circuit 505a to perform the likelihood weighting functions of the PF techniques. As illustrated, the adder 520 can derive a new state in the model by adding the looked-up state update information from the RRAM 515 to a variable $\phi^* \alpha_t$. The likelihood calculator 530 can be described as performing the likelihood weighting functions of the PF techniques. The likelihood calculator 530 can compute the likelihood of an observation for the state. FIG. 5 illustrates, for example, that the likelihood calculator 530 can be configured to execute equation (2).

The resampler 540 is configured to implement the resampling functions of the PF technique. The resampler 540 performs resampling for each particle, where the plurality of aCAM core circuit 505n are utilized to propagate the many particles to estimate the density. In an implementation, the aCAM Particle Filter 500 can include a number of aCAM core circuits 505n that is equal to the number of particles for resampling. FIG. 5 illustrates that the plurality of aCAM core circuits 505n can comprise N number of copies of the circuit in order to implement N number of particles in the PF method. Thus, the aCAM Particle Filter 500 has the capability to process in parallel, thereby improving the efficiency and lowering the latency of the computation in the hardware. Further, in some implementations, model parameter updates are controlled by an outer Metropolis Hastings loop.

Moreover, in some implementations, CAM compression is implemented in the hardware. An aCAM array can be segmented, and the columns of the aCAM array "reused" for mapping different parts of the distribution by only turning on (e.g., searching) one set of rows in an array. Because aCAMs can operate in a mode where only certain rows are selected to be searched (e.g., by enabling the row line voltage, SL), the distribution can be divided to be stored into sections and 'fold' (i.e., store) the distribution amplitudes of the different sections in the same aCAM columns. During a search operation, the relevant 'section' is searched, by enabling the correct rows in the aCAM array. The calculations for the row-enable (e.g., based on the RNG result) can be calculated in parallel with other steps in the algorithm (such as resampling), and thus does not add latency overhead and would be minimal power overhead. Further, this implementation may realize various advantages, such as: more efficient mapping of the distribution to the aCAM area; and lowering the CAM search energy when sampling the distribution (as only certain aCAM rows are activated).

According to the embodiments, the aCAM Particle Filter 500 achieves MCMC sampling form the probability distributions, and then estimates densities of unknown quantities using the PF method. Thus, the disclosed embodiments achieves computations for complex likelihood functions in a manner that achieves high parallelism, low latency, and reduced computational costs.

Figure 7:
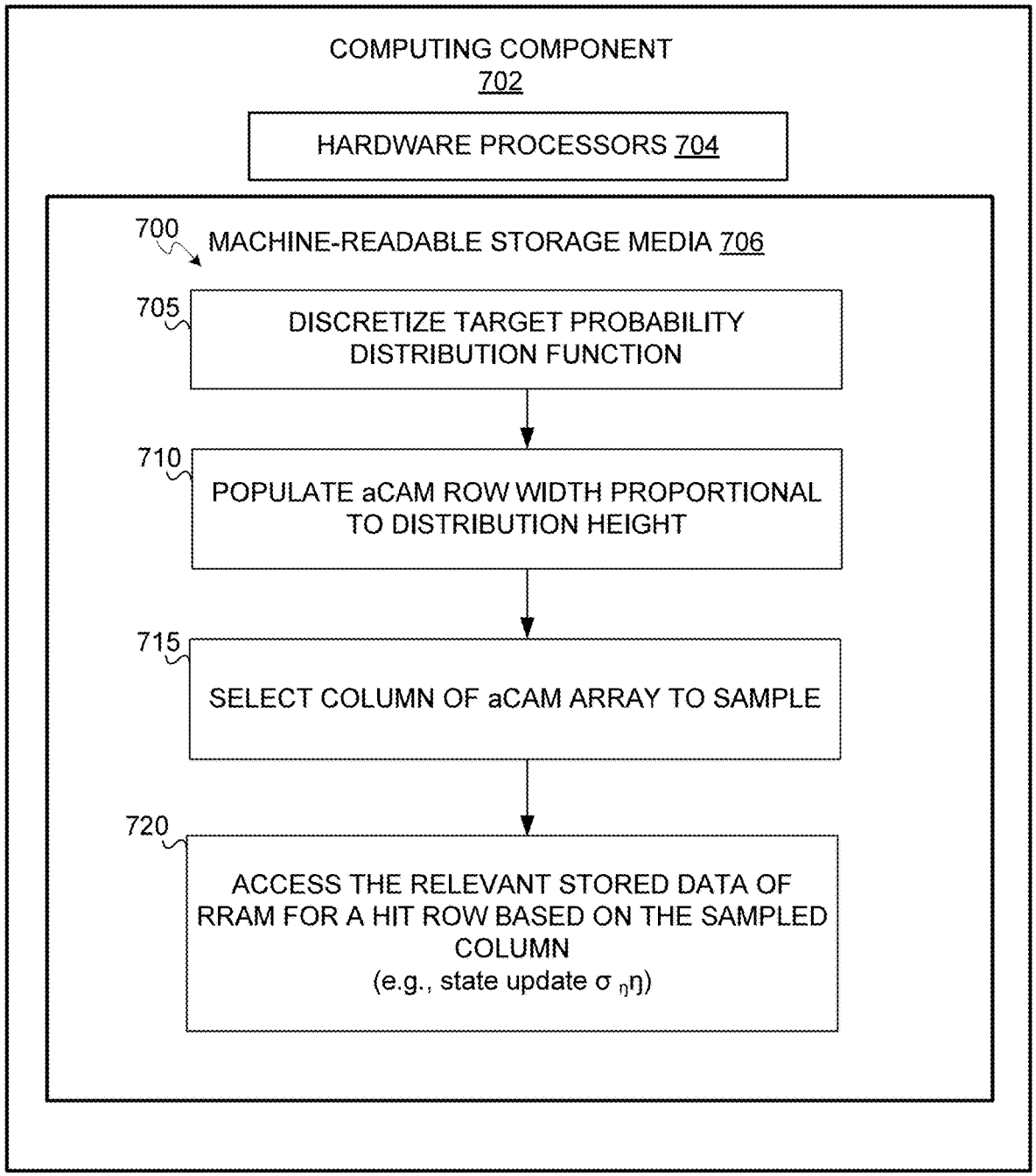
FIG. 7 is an operational flow diagram illustrating a process for mapping an arbitrary probability distribution to the aCAM core circuit shown in FIG. 4, according to some embodiments.

Further details of mapping an arbitrary probability distribution to the aCAM hardware to enable low latency sampling are now described with reference to FIG. 7. An example of a process 700 illustrated in FIG. 7, that is performed according to one embodiment of the systems and methods described herein. As seen in FIG. 7, process 700 is illustrated as a series of executable operations in a machine-readable storage media 706 performed by a hardware processor 704. The computing component 702 can be a computer device used in configuring and/or driving the aCAM core circuit (shown in FIG. 4). Generally, process 700 implements mapping of an arbitrary probability function to aCAM circuitry, according to some embodiments.

Process 700 can begin at operation 705, where a target probability distribution function is discretized. The target PDF can be implemented as various forms of PDF that are suitable for probabilistic computing, MCMC, and PF methods, such as Gaussian PDF, an arbitrary PDF, and the like. As result of operation 705, the curve of a PDF can be represented as a set of discretized points (as illustrated in FIG. 4).

Next, at operation 710, the width of an aCAM row is populated to be proportional to the distribution height (or amplitude) at a discretized point. For example, operation 710 can be repeated for each discretized point that is generated in previous step 705. Each discretized point can correspond to a different aCAM row, for example within the aCAM array of FIG. 4, in order to achieve uniform mapping. Thus, the populated width for each aCAM row can correspond to a particular distribution height for the row's corresponding discretized point. Accordingly, in some implementation, operation 710 can include a process for assigning a discretize point to its corresponding aCAM row. In some embodiments, operation 710 involves CAM compression, where the aCAM array is segmented to be "reused" for mapping different portions of the distribution. As a result of operation 710, the aCAM array stores the probability distribution function (or a cumulative distribution function representing the PDF).

The process can continue to operation 715, which performs a sampling of the PDF that was previously stored in the aCAM by operation 710. A column of the aCAM array is selected in order to sample the PDF during operation 715. In some implementations, operation 715 is performed by a uniform RNG, which selects the column to do an aCAM lookup. Alternatively, in some implementations, a non-uniform RNG can be used change the PDF that is sampled. In response to obtaining a hit in one of the aCAM rows, based on the searched column, the process can continue to operation 720. In other words, if an analog voltage value that is searched on the selected column matches a populated width of a particular aCAM row, the match line for that row can drive a memory lookup the next step of the process 700.

At operation 720, a hit row in the sampling drives an access to stored data in an RRAM. The RRAM can be directly connected to the aCAM array, thus a match line from an aCAM row drives a look-up directly to a connected memory cell within the RRAM. According to the embodiments, the RRAM stores information that is pertinent to processing a model, such as state updates and/or state evolution information. A key aspect of utilizing a RRAM is that new model parameters simply requires reprogramming the RRAM, and not the entire aCAM array (if the distribution function is the same). Also, the RRAM can be configured to store multiple models. For instance, the RRAM block can include a plurality of columns of memory cells, where each column stores the parameters for a different model. Consequently, the sampling step, at operation 715, can process the multiple stored models in parallel. In this embodiment, operation 720 can drive lookups to the RRAM for multiple state updates for each of the different models to step through.

Subsequently, the RRAM outputs the state update that is stored in the corresponding memory cell, as accessed in operation 720. The state update then be used to perform additional operations of probabilistic computing techniques, enabling the process 700 to achieve, for example, high speed MCMC sampling using aCAMs in a manner that can be easily expanded to more complex models and applications (e.g., engineering problems, deep neural networks, etc.).

FIG. 8 depicts a block diagram of an example computer system 800 in which various embodiments described herein may be implemented. For example, the computer system 800 may employ the disclosed aCAM circuitry to implement techniques, such as mapping an arbitrary probability distribution to an aCAMs, sampling, MCMC sampling, PF method, etc. The computer system 800 includes a bus 802 or other communication mechanism for communicating information, one or more hardware processors 804 coupled with bus 802 for processing information. Hardware processor(s) 804 may be, for example, one or more general purpose microprocessors.

The computer system 800 also includes a main memory 806, such as a random-access memory (RAM), cache and/or other dynamic storage devices, coupled to bus 802 for storing information and instructions to be executed by processor 804. Main memory 806 also may be used for storing temporary variables or other intermediate information during execution of instructions to be executed by processor 804. Such instructions, when stored in storage media accessible to processor 804, render computer system 800 into a special-purpose machine that is customized to perform the operations specified in the instructions.

The computer system 800 further includes a read only memory (ROM) 808 or other static storage device coupled to bus 802 for storing static information and instructions for processor 804. A storage device 810, such as a magnetic disk, optical disk, or USB thumb drive (Flash drive), etc., is provided and coupled to bus 802 for storing information and instructions.

The computer system 800 may be coupled via bus 802 to a display 812, such as a liquid crystal display (LCD) (or touch screen), for displaying information to a computer user. An input device 814, including alphanumeric and other keys, is coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812. In some embodiments, the same direction information and command selections as cursor control may be implemented via receiving touches on a touch screen without a cursor.

The computing system 800 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

The computer system 800 may implement the techniques described herein using customized hard-wired logic, one or more ASICs or FPGAs, firmware and/or program logic which in combination with the computer system causes or programs computer system 800 to be a special-purpose machine. According to one embodiment, the techniques herein are performed by computer system 800 in response to processor(s) 804 executing one or more sequences of one or more instructions contained in main memory 806. Such instructions may be read into main memory 806 from another storage medium, such as storage device 810. Execution of the sequences of instructions contained in main memory 806 causes processor(s) 804 to perform the process steps described herein. In alternative embodiments, hardwired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 810. Volatile media includes dynamic memory, such as main memory 806. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 802. Transmission media can also take the form of acoustic or light waves, such as those generated during radio-wave and infra-red data communications.

The computer system 800 also includes a communication interface 818 coupled to bus 802. Network interface 818 provides a two-way data communication coupling to one or more network links that are connected to one or more local networks. For example, communication interface 818 may be an integrated services digital network (ISDN) card, cable modem, satellite modem, or a modem to provide a data communication connection to a corresponding type of telephone line. As another example, network interface 818 may be a local area network (LAN) card to provide a data communication connection to a compatible LAN (or WAN component to communicated with a WAN). Wireless links may also be implemented. In any such implementation, network interface 818 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world-wide packet data communication network now commonly referred to as the "Internet." Local network and Internet both use electrical, electromagnetic or optical signals that carry digital data streams. The signals through the various networks and the signals on network link and through communication interface 818, which carry the digital data to and from computer system 800, are example forms of transmission media.

The computer system 800 can send messages and receive data, including program code, through the network(s), network link and communication interface 818. In the Internet example, a server might transmit a requested code for an application program through the Internet, the ISP, the local network and the communication interface 818.

The received code may be executed by processor 804 as it is received, and/or stored in storage device 810, or other non-volatile storage for later execution.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 800.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:
1. A method, comprising:
   discretizing a probability distribution function (PDF); and populating a width of one or more analog content addressable memories (aCAMs) to be proportional to a distribution height at a discretized point from the discretized PDF, wherein the populated aCAM is from a plurality of aCAMs.

2. The method of claim 1, wherein the one or more aCAMs are from a plurality of aCAMs arranged in rows and columns.

3. The method of claim 2, wherein each row of aCAMs corresponds to a discretized point of the discretized PDF.

4. The method of claim 3, wherein populating the width of one or more of the aCAMs comprises populating the width of one or more aCAMs in each row to be proportional to a distribution height at the corresponding discretized point such that the plurality of aCAMs stores a representation of the PDF.

5. The method of claim 4, further comprising:
selecting a column for sampling, wherein the column is from the plurality of aCAMs arranged in the rows and columns.

6. The method of claim 5, wherein sampling comprises:
determining whether a hit is produced for an aCAM in a hit row based on a value searched on the column matching a range of values stored within the populated width of the one or more aCAMs in the hit row, wherein the hit row is a row from the plurality of aCAMs arranged in the rows and columns.

7. The method of claim 6, further comprising:
in response to determining the hit row, accessing data stored in a memory cell of a resistive random-access memory (RRAM).

8. The method of claim 7, wherein the data stored in the memory cell is state update information associated with a model stored in the RRAM.

9. The method of claim 7, wherein the memory cell corresponds to a match line for the hit row.

10. The method of claim 7, wherein the model stored in the RRAM is a state space model.

11. The method of claim 1, wherein the PDF is an arbitrary PDF.

12. The method of claim 5, wherein the sampling comprises sampling the representation of the PDF that is stored by the plurality of aCAMs.

13. The method of claim 8, wherein the state update information is usable for likelihood estimation in accordance with Markov chain Monte Carlo (MCMC).

14. A hardware architecture, comprising:
an aCAM core circuit storing a known probability distribution function (PDF) and sampling the stored PDF; and
additional hardware coupled to the aCAM core circuit computing an estimation of a density of an unknown PDF based on the sampling of the stored PDF.

15. The hardware architecture of claim 14, wherein the aCAM core circuit comprises:
an aCAM array storing the known PDF; and
a resistive random-access memory (RRAM) coupled to the aCAM array, the RRAM storing a state evolution information associated with a state space model used for the estimation.

16. The hardware architecture of claim 14, wherein the additional hardware comprising:
an adder;
a likelihood calculator; and
a resample.

17. The hardware architecture of claim 16, wherein the aCAM core circuit executes sampling of a particle filter estimation.

18. The hardware architecture of claim 17, wherein the additional hardware executes weighting and resampling of the particle filter estimation.

19. The hardware architecture of claim 18, the additional hardware comprising:
a plurality of additional aCAM core circuits propagating through a plurality of particles in accordance with the particle filter estimation.

20. The hardware architecture of claim 19, wherein the plurality of additional aCAM core circuits comprises a number of additional aCAM core circuits that is equal to a number of particles for resampling in accordance with the particle filter estimation.

* * * * *